United States Patent
Gutkin

[19]

[11] Patent Number: 6,103,968
[45] Date of Patent: Aug. 15, 2000

[54] THERMAL GENERATOR AND METHOD OF PRODUCING SAME

[75] Inventor: Timofei Gutkin, Brooklyn, N.Y.

[73] Assignee: White Eagle International Technologies Group, Inc., New York, N.Y.

[21] Appl. No.: 08/924,072

[22] Filed: Aug. 28, 1997

Related U.S. Application Data

[63] Continuation of application No. 08/645,451, May 13, 1996, abandoned, which is a continuation-in-part of application No. 08/241,881, Feb. 28, 1994, abandoned.

[51] Int. Cl.$^7$ .................................................. H01L 35/28
[52] U.S. Cl. ...................... 136/203; 136/200; 136/201; 136/237
[58] Field of Search .................... 136/200, 201, 136/203, 205, 224, 225, 236.1, 237

[56] References Cited

U.S. PATENT DOCUMENTS

| | | | |
|---|---|---|---|
| 2,229,481 | 1/1941 | Telkes | 136/5 |
| 2,685,608 | 8/1954 | Justi | 136/4 |
| 2,798,989 | 7/1957 | Welker | 317/237 |
| 3,031,516 | 4/1962 | Pessel | 136/5 |
| 3,124,936 | 3/1964 | Melehy | 62/3 |
| 3,208,835 | 9/1965 | Duncan et al. | 29/195 |
| 3,296,033 | 1/1967 | Scuro et al. | 136/205 |
| 3,338,753 | 8/1967 | Horsting | 136/237 |
| 3,391,030 | 7/1968 | Beaver, Jr. et al. | 136/203 |
| 3,434,888 | 3/1969 | Beaver, Jr. | 136/203 |
| 3,524,771 | 8/1970 | Green | 136/203 |
| 3,674,568 | 7/1972 | Caprarola | 136/205 |
| 3,859,143 | 1/1975 | Krebs | 136/205 |
| 3,873,370 | 3/1975 | Hampl, Jr. et al. | 136/205 |
| 4,029,520 | 6/1977 | Hampl, Jr. | 136/205 |
| 4,492,809 | 1/1985 | Dahlberg | 136/212 |
| 5,006,178 | 4/1991 | Bijvoets | 136/211 |
| 5,156,004 | 10/1992 | Wu et al. | 62/3.1 |

FOREIGN PATENT DOCUMENTS

| | | | |
|---|---|---|---|
| 2-106079 | 4/1990 | Japan | 136/200 |

*Primary Examiner*—Kathryn Gorgos
*Assistant Examiner*—Thomas H. Parsons
*Attorney, Agent, or Firm*—Ilya Zborovsky

[57] ABSTRACT

A method of producing a thermal generator has the steps of forming two working branches including a negative branch and a positive branch, so that at least one of the branches is composed of a non-porous semiconductor material, subdividing the one branch composed of semiconductor material into two sections, and providing between the two sections a semiconductor zone having a disordered structure so as to reduce heat conduction between a hot end and a cold end of the thermal generator due to the zone with the disordered structure.

2 Claims, 2 Drawing Sheets

THERMAL GENERATOR AND METHOD OF PRODUCING SAME

CROSS REFERENCE TO RELATED APPLICATION

This application is a continuation of application Ser. No. 08/645,451 filed on May 13, 1996, now abandoned, which is a continuation-in-part of a patent application Ser. No. 08/241,881 filed on Feb. 28, 1994, now abandoned.

BACKGROUND OF THE INVENTION

The present invention deals with a method of and a device for producing heat/cold with electric energy. The present invention can be used in refrigerators and air-conditioners of high efficiency as well as for heating spaces by taking energy from outer areas having deep cold.

Cold producing machines usually produce cold from a supplied energy, such as mechanical, thermal or electrical energy. In known cooling devices, a working gas is Freon which inevitably escapes to the atmosphere. When refrigerators or air-conditioners are utilized in great numbers, the Freon leaks lead to substantial damages to the ecology. It is therefore extremely undesirable to use such refrigerators and air-conditioners.

On the other hand, semiconductor elements are known, in which when electric current is supplied through the semiconductor element, one end of the element becomes hot while the other end of the element becomes cold. Such an element usually includes a negative semiconductor branch and a positive semiconductor branch. The substantial disadvantage of such elements is their high thermal conductivity since they are formed as monolithic semiconductor elements. A direct flow of heat from the hot end to the cold end occurs in these elements, which reduces efficiency of the system and makes it unsuitable for practical use.

SUMMARY OF THE INVENTION

Accordingly, it is an object of the present invention to provide a method of producing heat or cold which increases efficiency, reduces the quantity of semiconductor material for positive and negative branches of the semiconductor element, reduces electric energy consumption, simplifies the manufacture, increases operational time of the system and does not offset the ecology.

In keeping with these objects and with others which will become apparent hereinafter, one feature of the present invention resides, briefly stated, in a method of producing heat or cold, in accordance with which in a negative branch of a semiconductor and in a positive branch of the semiconductor between hot and cold ends of the semiconductor, a disordered zone with a small thermal conductivity (high thermal resistance) and low electrical resistance is provided. The disordered zone is actually a porous zone having particles or grains which contact one another, but spaces or pores are provided between them The porous zone can be formed by two methods. In accordance with the first method, the semiconductor is cut into two sections, for example by rough diamond tool having large-size grains so that the facing surfaces of the semiconductor sections become-porous. As a result a semiconductor branch with good electrical contact is produced. At the same time, thermal conduction is reduced many times (more than three times) for each branch, which increases the efficiency of the thermal generator.

In accordance with a second method the zone of semiconductor is formed by films which are applied on the surfaces of the facing ends of the sections and having the same chemical composition as the semiconductor sections. Then sections are connected again to one another at a semiconductor branch with good electrical contact. Such films can be produced by well known methods so as to form a small-grain substructure having a high degree of porosity. Vapor condensation, gas spurting reactions, chemical precipitation and cathodic dispersion can be used for this purpose.

In the inventive method the disordering of the semiconductor introduces in it a high concentration of point-like defects which are randomly located in a lattice of the grains. This reduces the thermal conductivity at least three times on the one hand, and contributes to penetration of oxygen between the grains, in cracks and pores in the disordered layer as well as chemosorption on the surface of the grains, so that the electrons are caught from the volume of the grains and bonded in a surface, negatively charged barrier. As a result, concentration of holes is increased and the specific resistance is substantially reduced, which substantially exceeds some increase in the resistance due to disordering. Thus, the main disadvantage connected with emitting of Joules heat from flowing current is compensated. The heat conductivity and the electrical resistance are reduced, and therefore the thermal generator has high efficiency.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
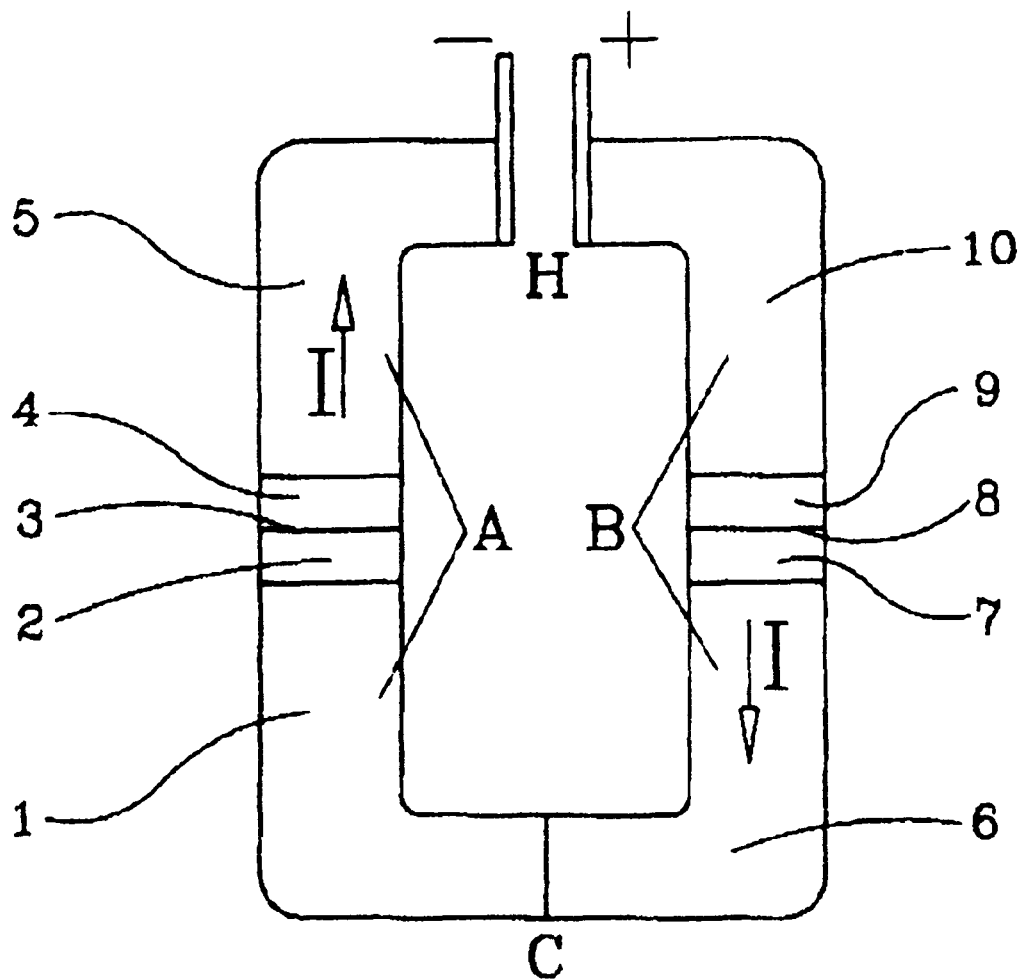
FIG. 1 is a view schematically showing a longitudinal section of a thermal generator with working branches composed of p-semiconductors and n-semiconductors.

FIG. 1 shows a thermal generator which has two working branches A and B. The working branch A is composed of a non-porous p-semiconductor while the working branch B is composed of a non-porous n-semiconductor. A cold end with a temperature $T_{cold}$ is identified as C, while a hot end with a temperature $T_{hot}$ is identified as H. Electric current I flows at the cold end from the branch B to the branch A, and at the hot end flows from the branch A to the branch B. Each branch A and B is divided into two sections. The working branch A containing p-semiconductor has a section 1 adjoining at the bottom of FIG. 1 to the cold end of the generator and its temperature $T_{cold}$. A layer 2 with a porous semiconductor structure is provided on the upper surface of this section. The section 1 with the layer 2 are connected by a contact 3 to a layer 4 composed of a porous semiconductor structure and arranged on a lower face of a section 5. The upper end of the section 5 adjoins the hot end with the temperature $T_{hot}$. Similarly the working branch B composed of n-semiconductor has a section 6 adjoining the cold end and having a temperature $T_{cold}$. The upper surface of this section is provided with a layer 7 having a porous semiconductor structure. The section 6 with the layer 7 are connected by a flat, solder contact 8 with a porous, disordered semiconductor layer 9 located on a lower surface of a section 10. The upper end of the section 10 adjoins above to the hot end with temperature $T_{hot}$.

As a result, between the hot end $T_{hot}$ and cold end $T_{cold}$ both in the branch A of p-semiconductor and the branch B of n-semiconductor, there is a disordered zone. In other words, between the hot end $T_{hot}$ and cold end $T_{cold}$ there is a zone which has low thermal conductivity which substantially reduced the heat flow from the hot end to the cold end.

Figure 2:
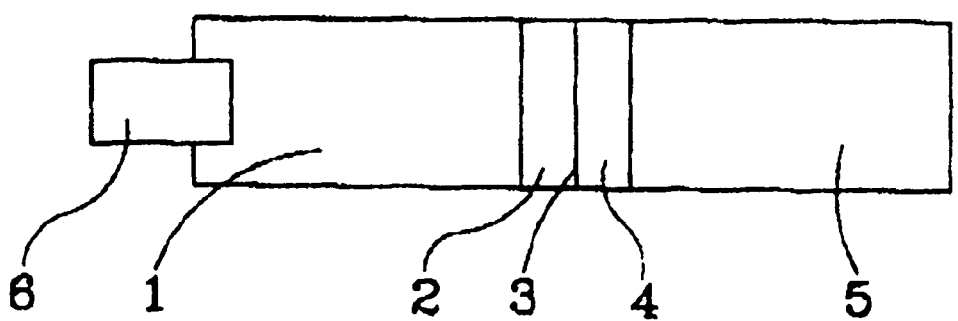
FIG. 2 shows schematically a longitudinal section of a thermal generator in which one working branch is composed of a p-semiconductor while a negative branch is formed by a metal band.
Figure 3:
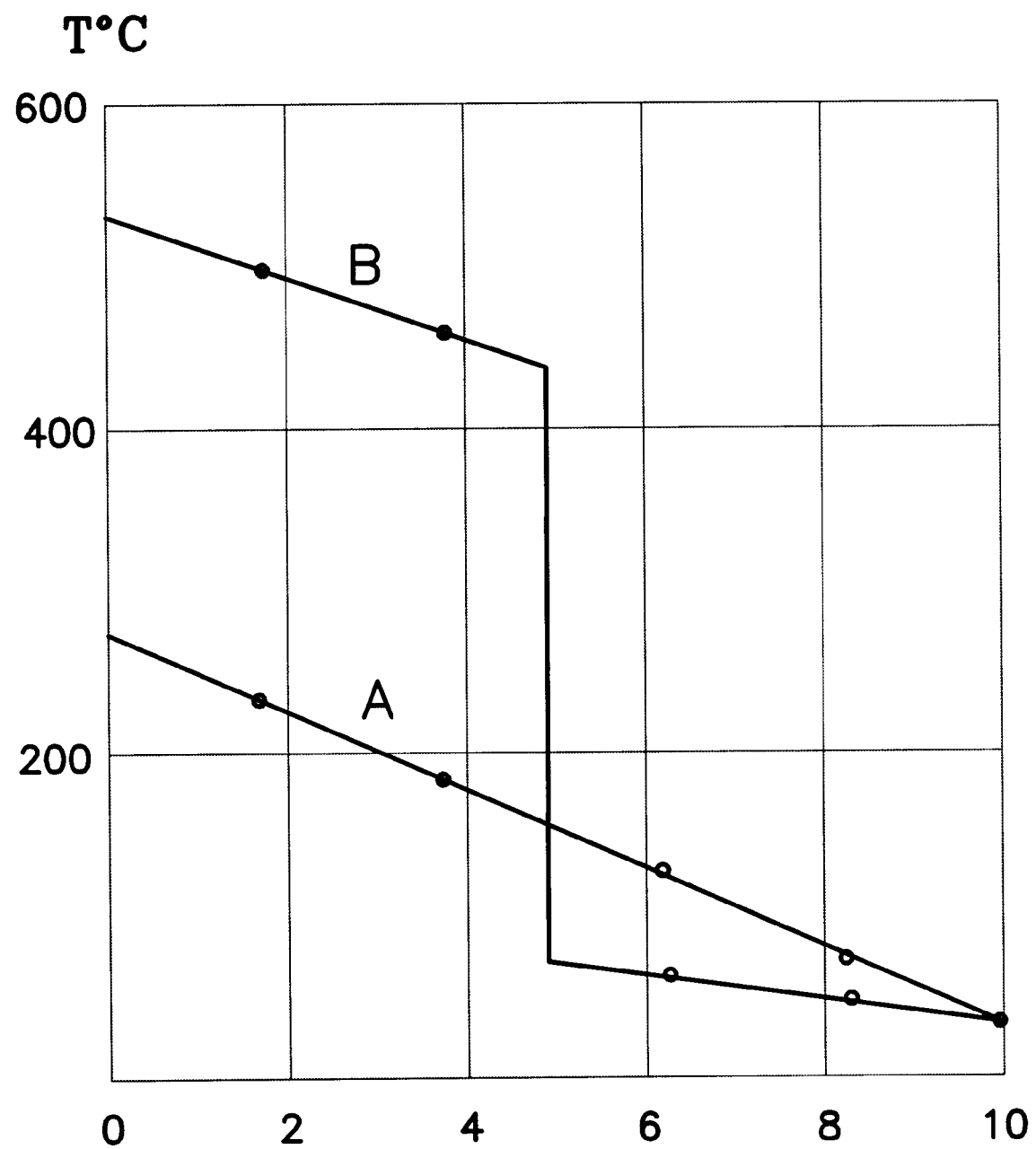
FIG. 3 illustrates the distribution of temperature for the thermal generator without an inventive porous layer A and for the thermal generator with the inventive zone of layer between hot and cold ends, B.

FIG. 2 shows a longitudinal section of a generator with a positive branch composed of p-semiconductor, and a negative branch composed of a metal band. Here also, in order to form a zone with low thermal conductivity, the working branch is subdivided into sections. The positive working branch has a section 1' adjoining the hot end with the temperature $T_{hot}$. The right surface of this section is provided with the porous, disordered, semiconductor layer 2'. The section 1' and the layer 2' are connected by a flat, solder contact 3' with a porous, disordered layer 4' arranged on the left surface of the section 5', and its right end forms a cold end with temperature $T_{cold}$, while the negative branch 6' is composed of metal.

Here also the semiconductor working branch is subdivided into sections for forming a zone with low thermal conductivity.

In accordance with thermal calculations, the thermal conductivity of the semiconductor element provided with the zone having disordered structure is at least three times smaller than the thermal conductivity of the semiconductor element which forms a branch and has a monolithic solid structure. During the operation the thermal flow passes from the hot end to the cold end in the branch. It reaches the area with high thermal resistance which is composed of the layers 2' and 4' with disordered structures. This provides complete temperature re-distribution when compared with the branch composed of the monolithic semiconductor. In the proposed thermal generators, a temperature drop takes place in the zone 2'–3'–4', which constitutes 70% of the total temperature drop between the hot and cold ends of the generator. Simultaneously with the decrease in the thermal conductivity as a result of the porous semiconductor structure between the hot end and the cold end, electrical resistance in the zone with porous semiconductor structure is reduced. The reason is that in this zone oxygen penetrates on boundaries between the grains, in microcracks and pores in the disordered layers, chemosorption of oxygen takes place on the surface of the grains, electrodes are caught from volume of the grains and form a negatively charged barrier. As a result, concentration of holes or electrons is increased and the specific resistance is lowered and exceeds some growth of electrical resistance caused by the disordered structure. Therefore, freezing with high efficiency can be achieved.

When the thermal generator is designed in accordance with the present invention, it is characterized by increased efficiency of transformation of electrical energy into cold or heat. In view of this, large temperature drops between the hot end and the cold end of the thermal generator can be obtained. In the proposed thermal generator the cold or heat efficiency results from considerable reduction of thermal energy of flow from the hot end to the cold end. The productive power loss, in particular the thermal energy loss is considerably reduced because of reduced conduction of heat between the hot and cold ends in the working branches. At the same time, electrical resistance is reduced as well. These results are achieved by forming the above mentioned zone with disordered structure between the hot end with a temperature $T_{hot}$ and the cold end with the temperature $T_{cold}$. The zone with disordered structure can be formed as described hereinabove, either by mechanical action, such as for example cutting or mechanical treatment of surfaces of the facing ends of the sections, or by deposition on the surfaces of the facing ends of the sections of a semiconductor layer with the same chemical composition but with porous structure. Also, in the thermal generator in accordance with the present invention the length of semiconductor branches can be reduced with the resulting saving of semiconductor material. The electrical resistance of the working branches is reduced and therefore the power loss on Joules heat is reduced as well. When it is necessary to heat a space by passing electric current in a corresponding direction, the heat quantity emitted at the inner end almost two times exceeds expenses for producing electrical current, while the remaining energy is taken from the environment. The inventive thermal generator is characterized by substantially reduced electrical power consumption.

It will be understood that each of the elements described above, or two or more together, may also find a useful application in other types of constructions differing from the types described above.

While the invention has been illustrated and described as embodied in a method of producing cold or heat with use of electric energy, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed and desired to be protected by letters patent is set forth in the appended claims:

1. A method of producing a thermal generator comprising the steps of forming two working branches including a negative branch and a positive branch, so that at least one of the branches is composed of a semiconductor material; subdividing said at least one branch composed of semiconductor material into two sections; and providing between the two sections two porous semiconductor structures, one porous semiconductor structure in each of the two sections, the two porous semiconductor structures connected by a solder contact which does not contact the two sections, so as to reduce heat conduction between a hot end and a cold end of the thermal generator due to the zone with the porous structure.

2. A thermal generator, comprising two branches including a negative branch and a positive branch, one of said branches being composed of a non-porous semiconductor material and composed of two separate sections; and two porous semiconductor structures between the two sections, one porous semiconductor structure on each of the non-porous semiconductor sections, the two porous semiconductor structures connected by a solder contact which does not contact the two sections so as to reduce heat conduction between a hot end and a cold end of the thermal generator.

\* \* \* \* \*